United States Patent
Misra et al.

(10) Patent No.: US 9,999,158 B2
(45) Date of Patent: Jun. 12, 2018

(54) THERMALLY CONDUCTIVE EMI SUPPRESSION COMPOSITIONS

(71) Applicant: HENKEL IP & HOLDING GMBH, Duesseldorf (DE)

(72) Inventors: Sanjay Misra, Shoreview, MN (US); John Timmerman, Minneapolis, MN (US); Kasyap Seethamraju, Eden Praire, MN (US)

(73) Assignee: HENKEL IP & HOLDING GMBH, Duesseldorf (DE)

( * ) Notice: Subject to any disclaimer, the term of this patent is extended or adjusted under 35 U.S.C. 154(b) by 650 days.

(21) Appl. No.: 13/733,668

(22) Filed: Jan. 3, 2013

(65) Prior Publication Data
US 2014/0182924 A1 Jul. 3, 2014

(51) Int. Cl.
*H05K 9/00* (2006.01)
*H05K 7/20* (2006.01)

(52) U.S. Cl.
CPC ......... *H05K 7/20454* (2013.01); *H05K 9/003* (2013.01); *Y10T 428/25* (2015.01)

(58) Field of Classification Search
CPC .... H05K 7/20; H05K 7/2039; H05K 7/20454; H05K 9/00; H05K 9/0007; H05K 9/002; H05K 9/0022; H05K 9/0024; H05K 9/003
See application file for complete search history.

(56) References Cited

U.S. PATENT DOCUMENTS

| | | |
|---|---|---|
| 3,576,723 A | 4/1971 | Angele et al. |
| 4,495,378 A | 1/1985 | Dotzer et al. |
| 5,179,381 A * | 1/1993 | Hatakeyama ......... H01Q 17/00 342/1 |
| 5,366,664 A | 11/1994 | Varadan et al. |
| 5,557,064 A | 9/1996 | Isern-Flecha et al. |
| 6,284,363 B1 | 9/2001 | Maeda et al. |
| 6,503,964 B2 | 1/2003 | Smith et al. |
| 6,514,428 B2 | 2/2003 | Suzuki et al. |
| 6,557,859 B2 | 5/2003 | McCullough et al. |
| 6,563,044 B2 | 5/2003 | Ducros et al. |
| 6,657,297 B1 | 12/2003 | Jewram et al. |

(Continued)

FOREIGN PATENT DOCUMENTS

| | | |
|---|---|---|
| JP | 2716427 | 2/1998 |
| JP | 2003023287 | 1/2003 |

(Continued)

OTHER PUBLICATIONS

Shore hardness comparison chart Asker C to A downloaded from http://us.misumi-ec.com/maker/misumi/mech/product/ur/faq/ on Jul. 31, 2015.*

(Continued)

*Primary Examiner* — Elizabeth A Robinson
(74) *Attorney, Agent, or Firm* — Taylor M. Coon

(57) ABSTRACT

An interface pad for suppressing electromagnetic and radio frequency radiation includes first and second generally opposing sides which define a thickness therebetween, with the interface pad exhibiting thermal conductivity, electrical resistivity, and a hardness of between 10-70 Shore 00 at 20° C. The interface pad is capable of attenuating electromagnetic and/or radio frequency radiation that is commonly associated with interference of electronic components.

10 Claims, 5 Drawing Sheets

(56) References Cited

U.S. PATENT DOCUMENTS

| | | |
|---|---|---|
| 6,695,985 B2 | 2/2004 | Igarashi et al. |
| 6,780,927 B2 | 8/2004 | Ducros et al. |
| 6,919,504 B2 | 7/2005 | McCutcheon et al. |
| 6,921,780 B2 | 7/2005 | Ducros et al. |
| 7,030,172 B2 | 4/2006 | Sakurai |
| 7,038,009 B2 | 5/2006 | Sagal et al. |
| 7,208,192 B2 | 4/2007 | Bunyan et al. |
| 7,625,633 B2 | 12/2009 | Kawaguchi et al. |
| 7,965,514 B2 | 7/2011 | Hill et al. |
| 2002/0090501 A1 | 7/2002 | Tobita |
| 2003/0220432 A1 | 11/2003 | Miller et al. |
| 2004/0054029 A1 | 3/2004 | Fujiki et al. |
| 2009/0059489 A1* | 3/2009 | Yoo ............ H05K 9/0096 361/679.21 |
| 2009/0087608 A1 | 4/2009 | An et al. |
| 2010/0321897 A1 | 12/2010 | Hill |
| 2011/0242764 A1 | 10/2011 | Hill et al. |
| 2012/0061135 A1 | 3/2012 | Hill |

FOREIGN PATENT DOCUMENTS

| | | |
|---|---|---|
| JP | 2004134604 | 4/2004 |
| JP | 2004134604 A * | 4/2004 |
| JP | 2008124258 | 5/2008 |
| JP | 2012081663 A | 4/2012 |
| KR | 10-0743819 | 7/2007 |
| KR | 10-2008-0082744 | 9/2008 |

OTHER PUBLICATIONS

Shore hardness comparison chart A to 00, 2008, downloaded from http://www.smooth-on.com/pdf/durometer_with_logo.pdf on Jul. 31, 2015.*

Translation of Official Action in Japanese Patent Office for Japanese application No. 2014-006063 (related Japanese patent application).

European Supplemental Search Report Issued in related European patent application No. WP141567.7, dated Jul. 7, 2014, citing Japanese publication Nos. 2004134604 and 2008124258.

* cited by examiner

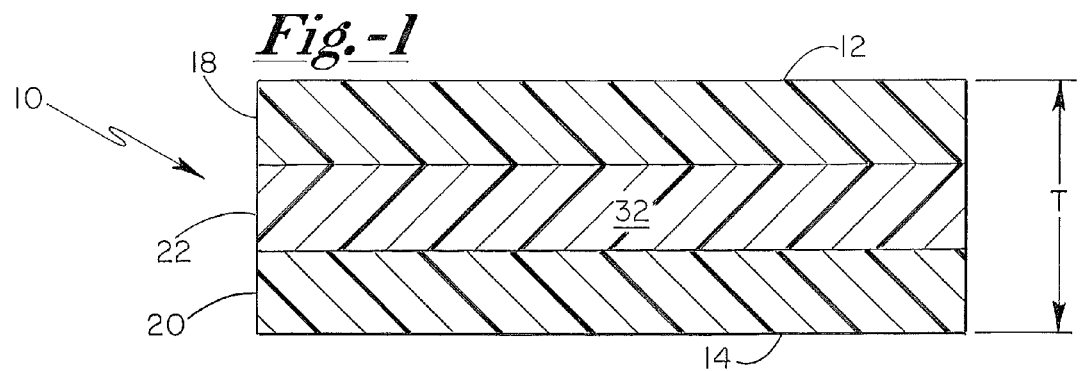
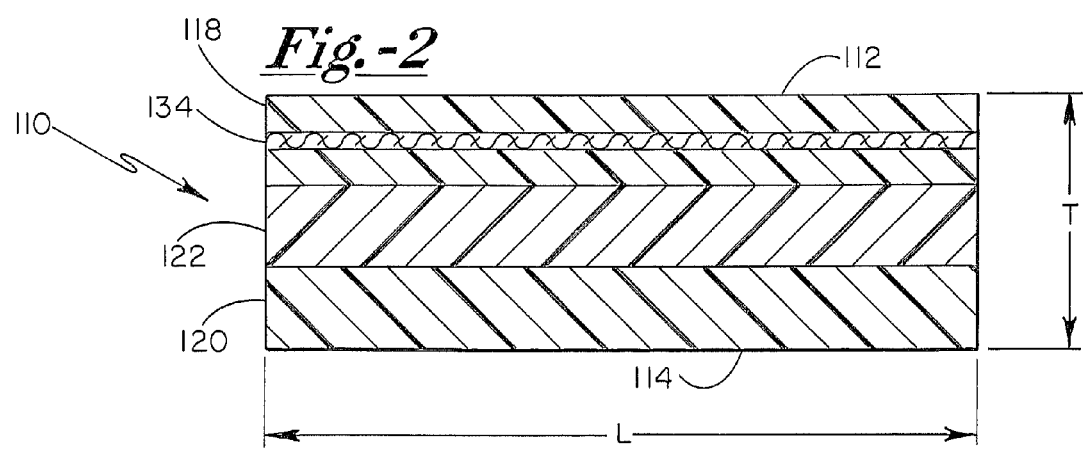
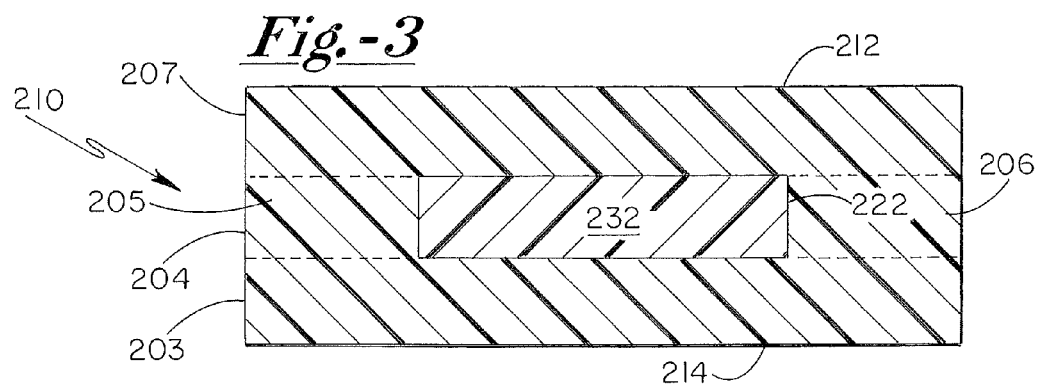

THERMALLY CONDUCTIVE EMI SUPPRESSION COMPOSITIONS

FIELD OF THE INVENTION

The present invention relates to electromagnetic and radio frequency radiation suppressing materials generally, and more particularly to thermally conductive interface products for use in connection with heat-generating electrical devices and heat sinking structures, wherein the interface products additionally act to suppress the propagation of electromagnetic and radio frequency radiation therethrough. The present invention further relates to methods for forming interface products having discrete functionality layers so as to enable electromagnetic and radio frequency interference suppression while providing an electrically isolative interface.

BACKGROUND OF THE INVENTION

Thermally conductive interface materials are widely utilized in the electronics industry for operably coupling heat-generating electronic components to heat-sinking structures. Most typically, such thermally conductive interface materials are utilized in connection with heat-generating electronic components such as integrated circuits (IC), central processing units (CPU), and other electronic components containing relatively high-densities of conductive traces and resistor elements. In particular, the thermal interface materials are often times utilized to operably couple such heat-generating electronic devices to heat sinking structures, such as finned heat sink structures. In such a manner, excess thermal energy generated by the electronic components may be expelled to the heat sinking structures via the thermal interface material.

Certain electronic devices, in addition to generating excess thermal energy, create electromagnetic radiation across various frequencies. Such radiation can have the effect of causing electromagnetic interference (EMI) and/or radio frequency interference (RFI) with other electronic devices susceptible to and/or tuned to receive electromagnetic or radio frequency wave forms. Devices sensitive to electromagnetic and radio frequency interference include, for example, cellular phones, portable radios, laptop computers, and the like.

As the prevalence of portable electronic devices which are sensitive to electromagnetic and/or radio frequency interference increases, manufacturers of internal electronic componentry for such devices have incorporated electromagnetic radiation-absorbing substances into thermally conductive interface materials disposed adjacent to the electromagnetic radiation-producing devices. Constructions have therefore been implemented in thermal interface materials which bear an operating characteristic of absorbing, reflecting, or otherwise suppressing the transmittance of electromagnetic and/or radio frequency radiation through the interface. As a result, such thermal interface material constructions act to provide a thermal release pathway while simultaneously suppressing transmittance of electromagnetic and/or radio frequency radiation from the corresponding electronic component to which the thermal interface material is addressed.

The thermal interface material constructions proposed to date for providing such characteristics, however, utilize homogeneous or quasi-homogeneous dispersions of radiation suppression substances within the thermal interface material backbone matrix. In doing so, the resultant compositions render the overall construction of low electrical resistance. The relatively low electrical resistivity of conventional electromagnetic and/or radio frequency interference suppression constructions fail to adequately electrically isolate structures such as heat sinks that are operably coupled to the respective heat and interference radiation-generating electronic components via the interface. Many applications exist, however, where such electrical isolation is preferred or required.

Conventional EMI suppression materials also tend to be relatively rigid, thereby diminishing their effectiveness as thermal conductors. The lack of compliance in conventional EMI suppression interfaces results in air gaps between the EMI suppression interface and the connected components. Such air gaps act as a relative thermal barrier, and diminish the overall thermal conductivity of the interface. Moreover, the relatively non-compliant conventional interface structures can cause damage to fragile electrical components in the assembly of the heat sinking apparatus, particularly as the heat sinks or external EMI shields are press-fit onto the EMI suppression interface.

It is therefore an object of the present invention to provide an electrically isolative thermal interface material that acts to operably suppress transmittance of electromagnetic and/or radio frequency radiation.

It is a further object of the present invention to provide an electrically isolative thermal interface material construction incorporating an electromagnetic and radio frequency interference suppression composition that is confined solely within a predefined portion of the thermal interface construction.

It is a still further object of the present invention to provide a thermally conductive interface product that is formed of a plurality distinct material layers, and only predefined ones of such layers contain electromagnetic and radio frequency radiation suppression material.

It is another object of the present invention to provide an electrically isolative thermally conductive interface product having the first and second major exposed surfaces being fabricated from an electrically insulative and thermally conductive material, and an electromagnetic and radio frequency interference suppression material contained solely within a portion of the interface product that is interposed between the electrically insulative portions thereof.

It is a further object of the present invention to provide a method of constructing a thermally conductive interface material having an electromagnetic and radio frequency radiation suppression characteristic, the method involving separately laying up distinct material layers having disparate compositions.

It is yet another object of the present invention to provide an electrically isolative thermal interface that is effective in suppressing electromagnetic and/or radio frequency radiation, and exhibits a low modulus so as to be compliant for improved thermal conductivity and soft for protection of electrical components in the assembly process.

SUMMARY OF THE INVENTION

By means of the present invention, electromagnetic and radio frequency radiation emission from electronic components may be suppressed, by being contained, and/or reflected so as to reduce and/or eliminate transmission thereof to radiation-sensitive equipment. The electromagnetic and radio frequency interference suppression apparatus of the present invention incorporates a construction useful in connection with integrated circuit applications, in that the construction provides an electrically insulative body that may be placed in direct contact with integrated circuit assemblies while simultaneously providing an electromagnetic and radio frequency interference suppression characteristic. Moreover, the interface may preferably exhibit a relatively low bulk modulus, so as to be soft and conformable.

In a particular embodiment, the interface pad of the present invention includes a body having a first surface and a generally opposed second surface defining a thickness therebetween. The body exhibits a thermal conductivity of at least 1 W/m·K through the thickness, a hardness of between 10-70 Shore 00 at 20° C., a volume electrical resistivity of at least $10^8$ Ω·m, and an attenuation of at least 1 dB of radiation having a waveform frequency of between 1-10 GHz.

In another embodiment, an electromagnetic interference suppression apparatus includes a body having a first surface and a generally opposed second surface defining a thickness therebetween. The body exhibits a thermal conductivity of at least 1 W/m·K through the thickness, a hardness of between 10-70 Shore 00 at 20° C., and a volume electrical resistivity of at least $10^8$ Ω·m. The body includes a first portion and a second portion, with the first portion including electromagnetic radiation suppression materials selected from magnetic metal powders, magnetic metal alloy powders, carbon fibers, graphite, polyacrylonitrile fibers, magnetic ceramics, Mn—Zn, Ni—Zn, Fe—Co, Fe—Si, and combinations thereof.

In a further embodiment, an electromagnetic interference suppression apparatus includes a shield member secured to a substrate and defining an enclosure, and an electronic component mounted at the substrate within the enclosure. The apparatus further includes an interference suppression body capable of attenuating radiation having a waveform frequency of between 1-10 GHz by at least 1 dB. The interference suppression body exhibits a thermal conductivity of at least 1 W/m·K, a hardness of between 10-70 Shore 00 at 20° C., and a volume electrical resistivity of at least $10^8$ Ω·m. The interference suppression body is disposed in the enclosure between the electronic component and the shield member.

In a further embodiment, an electromagnetic interference suppression apparatus of the present invention includes a body having a first surface and a generally opposed second surface defining a thickness therebetween, and a first portion and a second portion, with the first portion including electromagnetic radiation suppression material dispersed in a polymer matrix. The electromagnetic radiation suppression material is selected from magnetic metal powders, magnetic metal alloy powders, carbon fibers, graphite, polyacrylonitrile fibers, magnetic ceramics, Mn—Zn, Ni—Zn, Fe—Co, Fe—Si, and combinations thereof. The first portion is spaced from at least one of the first and second surfaces, and has a hardness of between 10-70 Shore 00 at 20° C. The second portion is coextensive with at least one of the first and second surfaces, and has a hardness of between 10-70 Shore 00 at 20° C.

BRIEF DESCRIPTION OF THE DRAWINGS

FIG. 1 is a cross-sectional view of an interface product of the present invention;
FIG. 2 is a cross-sectional view of an interface product of the present invention;
FIG. 3 is a cross-sectional view of an interface product of the present invention.

DETAILED DESCRIPTION OF THE PREFERRED EMBODIMENTS

Figure 4:
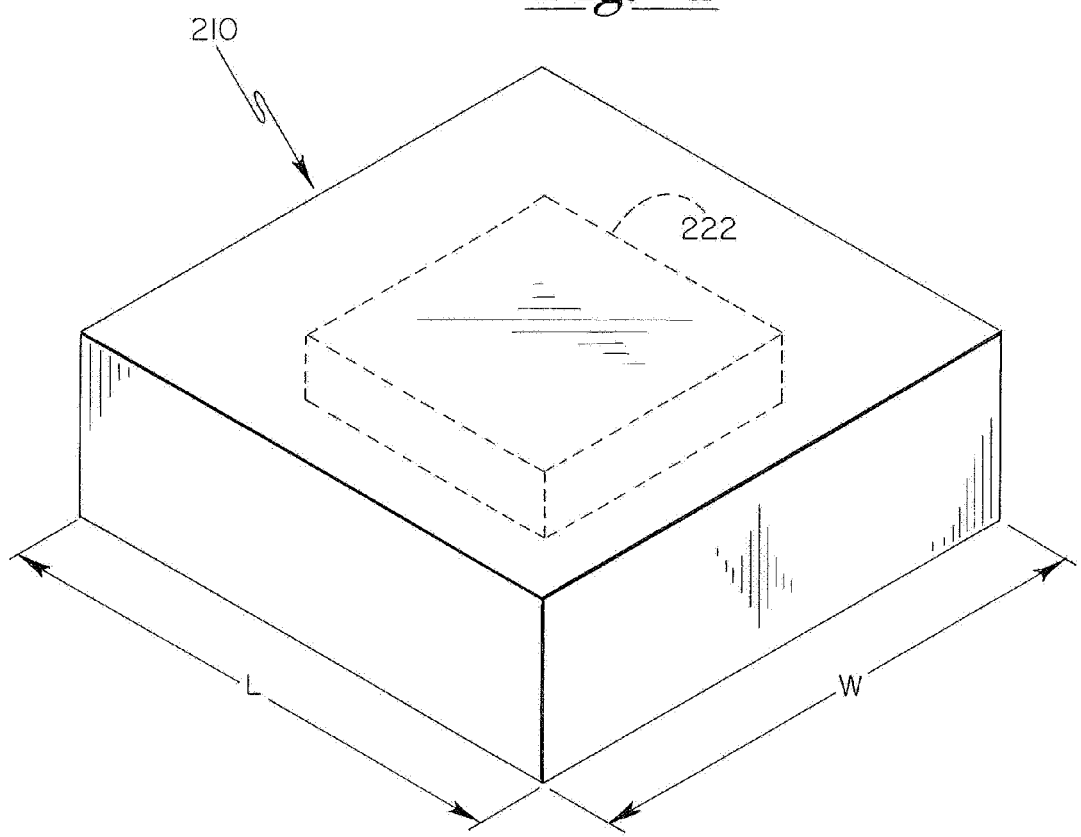
FIG. 4 is a perspective view of the interface product illustrated in FIG. 3.

The objects and advantages enumerated above together with other objects, features, and advances represented by the present invention will now be presented in terms of detailed embodiments described with reference to the attached drawing figures which are intended to be representative of various possible configurations of the invention. Other embodiments and aspects of the invention are recognized as being within the grasp of those having ordinary skill in the art.

For the purposes hereof, the terms "electromagnetic radiation", "electromagnetic interference", "radio frequency radiation", "radio frequency interference", "EMI", and "RFI" are intended to mean radiation that is capable of interfering with the normal operation of electronic components, such as processors, transmitters, receivers, and the like. Such radiation may typically be in the range of 1-10 GHz. The terms listed above, as well as other similar terms, are intended to refer to radiation in this frequency range, and may therefore be used interchangeably to define the radiation transmission affected (absorbed, reflected, contained, etc.) by the materials of the present invention.

With reference now to the drawing figures, and first to FIG. 1, an interface pad 10 of the present invention includes a first side 12 and a second side 14 in generally opposing relationship to one another, and defining a thickness "T" of pad 10 therebetween. Interface pad 10 preferably includes a first portion 18 disposed along first side 12, a second portion 20 disposed along second side 14, and a third portion 22 interposed between first and second portions 18, 20. In preferred embodiments, interface pad 10 includes an electromagnetic and/or radio frequency interference suppression material 32 that is confined solely within third portion 22. Suppression material 32 is preferably in the form of particulate fillers dispersed in a thermoplastic or thermosetting polymer matrix of third portion 22. Such interference suppression material 32 may be selected from a wide variety of electromagnetic and radio frequency radiation absorbing or reflecting substances. Materials useful in absorbing electromagnetic radiation over a wide frequency range include magnetic metal powders, such as iron or iron alloys. Other magnetic metal, magnetic metal oxide ceramics, graphite/carbon powders, and metal alloy fillers may be utilized in addition to, or in place of, the iron or iron alloy powders. Moreover, non-metallic fillers are useful as electromagnetic interference suppression materials.

Specific illustrative examples of useful interference suppression materials 32 include Mn—Zn, Ni—Zn, Fe—Ni, Fe—Si, Fe—Al, Fe—Co, alloys of iron and conductive metallic and non-metallic fillers such as silver, copper, carbon, and graphite, as well as boron nitride, polyacrylonitrile, graphite and magnetic ceramics standing alone within a polymeric matrix backbone. The above materials are exemplary only, and are not intended to be limiting to the use of the various interference suppression materials known in the art. Typically, interference suppression materials 32 are in the form of particulate matter having a loading concentration that is effective to diminish the transmission of the radiation through the interface to a desired extent. An example particulate loading concentration of the radiation-suppression materials is about 120 phr.

Suppression material 32 is preferably dispersed within a thermoplastic or thermosetting polymer matrix. Examples of thermoplastic and thermosetting resins useful in the polymeric matrix of third portion 22 include, for example, silicone, acrylic, urethane, epoxy, polysulfide, polyisobutylene, and polyvinyl or polyolefin based polymers. Polymeric matrices developed from such thermoplastic or thermosetting resins provide a relatively soft and flexible substrate in which suppression material 32 may be dispersed at a concentration of between about 5 and 85% by volume of third portion 22.

In some embodiments of the present invention, third portion 22 may further include thermally conductive filler material for aiding in the transfer of thermal energy therethrough. Such thermally conductive fillers are well known in the art, and include, for example, alumina, aluminum nitride, aluminum hydroxide, aluminum oxide, boron nitride, zinc nitride, and silicon carbide. Other thermally conductive particulate filler materials are contemplated by the present invention as being useful in the various thermally conductive portions of interface pad 10, each of which thermally conductive filler substances are widely utilized and well known in the art. The thermally conductive filler material may be dispersed within third portion 22 at a concentration of between about 5 and 90% by volume so as to render third portion 22 with a thermal conductivity value of at least about 0.25 W/m·K, and more preferably between about 1.0 and 5.0 W/m·K.

In the embodiment illustrated in FIG. 1, first and second portions 18, 20 are preferably fabricated from an electrically insulative material to thereby provide interface pad 10 with an electrically isolative characteristic. For the purposes hereof, the terms "electrically isolative" and "electrically insulative" are intended to mean a material with sufficient electrical resistivity to minimize or eliminate electrical transmission through the interface at normal operating voltages of electronic components typically found in electronic devices such as computers, cellular phones, computer servers, television and computer monitors, computer tablets, and the like. An example electrical volume resistivity of the present interfaces, such as interface pad 10, may be at least about $10^8$ Ω·m. In some embodiments, the desired electrical volume resistivity may be about $10^{10}$ Ω·m. First and second portions 18, 20, therefore, are preferably fabricated as a relatively soft and flexible, electrically insulative substrate such as silicone, polyethylene, polybutadiene, acrylic, epoxy, and urethane.

An aspect of the present invention is in the fact that the electromagnetic and radio frequency radiation suppression material 32 may be confined solely to third portion 22, and not incorporated in, for example, first and second portions 18, 20 of interface pad 10. In such a manner, first and second portions 18, 20 maintains its electrically insulative property by not incorporating the electrically conductive suppression material 32 therein.

Preferably, however, one or more of first and second portions 18, 20 may include thermally conductive filler material selected from the materials described above with reference to third portion 22. As such, first and second portions 18, 20 preferably provide a thermal interface medium so that when one or both of first and second sides 12, 14 are placed into operable contact with respective electronic componentry, thermal energy may be drawn from heat-generating components and delivered to heat sinking components. In preferred embodiments wherein each of first, second, and third portions 18, 20, 22 include thermally conductive filler material, a complete and efficient thermal pathway is provided through thickness "T" of interface pad 10, where thickness "T" is between about 0.01 and 0.5 inches in dimension. In other words, applications placing, for example, first side 12 in adjacent disposition with a heat-generating electronic component, an efficient thermal pathway is established from first side 12 to second side 14 of interface pad 10 sequentially via first portion 18, third portion 22, and second portion 20, and further to a heat sink component placed adjacent to second side 14 of interface pad 10.

Preferably, the backbone material utilized in each of first, second, and third portions 18, 20, 22 provide an overall soft and flexible characteristic to interface pad 10. Specifically, interface pad 10 preferably exhibits an overall modulus of less than about 5 MPa, and more preferably a bulk modulus of less than 1 MPa, as well as a bulk hardness of between about 10 Shore 00 and 50 Shore A, and more preferably a bulk hardness of between 10 Shore 00 and 70 Shore 00, all at room temperature of 20° C. Interface pad may even more preferably exhibit a hardness of between 15 Shore 00 and 30 Shore 00 at 20° C. In some embodiments, the hardness may represent interface pad 10 in its entirety, while in other embodiments, the hardness values may apply to outer surface layers for compliance in contact with electronic components and/or heat sinks and shielding members. Such flexibility and softness enables the application of interface pad 10 to uneven surfaces of respective electronic components without the formation of gaps between respective first and second sides 12, 14 of interface pad 10 and the corresponding electronic components and heat sinks. The conformability aspect of interface pad 10, brought about by its low modulus and hardness values, is important in ensuring a continuous contact area between the thermal interface material and the associated electronic components so as to maximize heat transfer efficiency, as well as to minimize the risk of damage to the electronic components in the assembly of heat sinks and/or shields with respect to the electronic components via the thermal transfer and EMI shielding interface. To that end, materials making up the outer peripheral boundaries at first and second sides 12, 14 of interface pad 10 are preferably soft at room temperatures, and may even be liquidly dispensable at 20° C.

Figure 5:
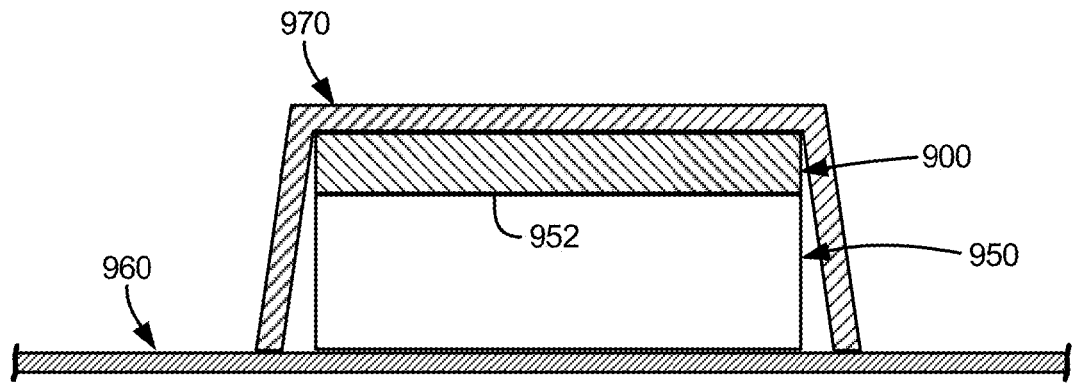
FIG. 5 is a schematic cross-sectional illustration of a prior art suppression interface utilized in an electromagnetic interference suppression apparatus.

In addition to benefiting heat transfer and minimizing the risk of damage to electronic components in assembly processes, the soft and compliant characteristic of the present interface material may also provide enhanced electromagnetic shielding/suppression by being able to "wrap around" the electronic component structure that is either emitting electromagnetic radiation, or is susceptible to interference caused by other sources of radiation. A pictorial contrast between the interface of the present invention and conventional EMI suppression interfaces is illustrated in FIGS. 5 and 6, wherein prior art interface 900 is relatively rigid and secured between an electronic component 950 mounted on circuit board 960 and a heat sink/radiation shield 970. In this typical arrangement, the prior art interface 900 is positioned at a first surface 952 of electronic component 950. Due to the relative rigidity and hardness of prior art interface 900, air gaps are likely left between interface 900 and first surface 952, and between interface 900 and shield 970. Moreover, assembly of shield 970 to substrate/circuit board 960 can result in the imposition of forces against interface 900 that, due to its relative rigidity, are transmitted to electronic component 950. In some cases, such forces can damage electronic component 950.

Figure 6:
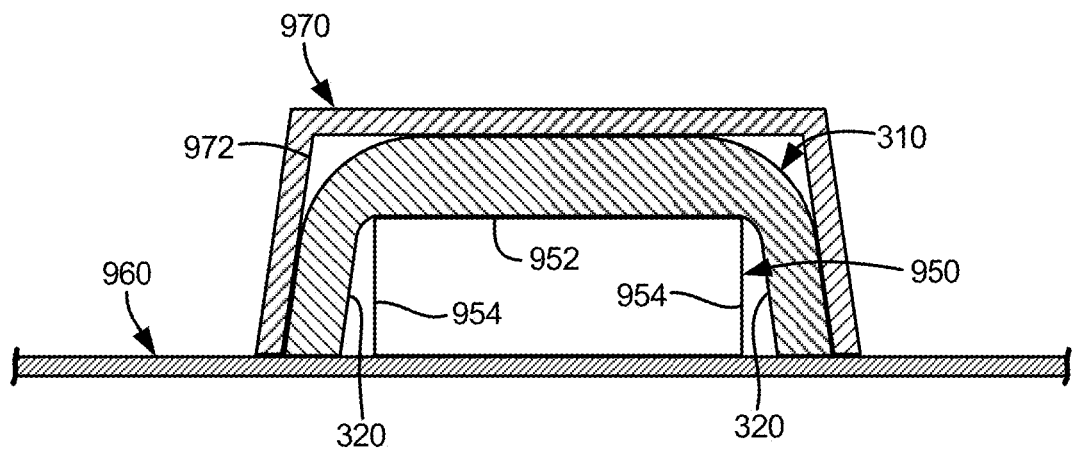
FIG. 6 is a schematic cross-sectional illustration of an electromagnetic interference suppression apparatus of the present invention.

The present interface, illustrated as interface 310 in FIG. 6, is preferably soft, flexible, and compliant to an extent that minimizes the transmittance of the mounting forces described above when mounting shield/heat sink 970 to substrate/circuit board 960. Instead of being transmitted to electronic component 950, the mounting forces are absorbed in the deformation of interface 310, as a result of its soft and compliant property. Moreover, the soft, flexible, and compliant interface 310 preferably conforms to first surface 952 of electronic component 950, and to inner surface 972 of shield/heat sink 970 in order to minimize or eliminate thermal transfer-impeding air gaps. Interface 310 therefore establishes a more efficient thermal bridge between electronic component 950 and shield/heat sink 970.

An additional advantage of the present interface 310 is illustrated in FIG. 6, wherein the softness and flexibility of interface 310 permits end portions 320 to "wrap around" electronic component 950. As a consequence, potentially interfering radiation emitted from side surfaces 954 of electronic component 950 are also absorbed, contained, or reflected by interface 310. In this manner, a flexible interface pad 310 may substantially form a radiation suppression encapsulation about electronic component 950 to more fully inhibit the emission of potentially interfering radiation from component 950. It is to be understood that interface member 310 may also or instead protect electronic component 950 from incoming radiation that could interfere with the operation of component 950. Interface 310 may therefore act as a suppressive shield to both outgoing and incoming interference radiation.

While interface 310 may be sufficiently soft and flexible to "wrap around" or substantially encapsulate electronic component 950, it is preferred that its bulk modulus or bulk hardness properties are such so as to permit handleability of interface 310. In other words, it is desired that interface 310 have a softness that is within a workable range that provides both the compliance and flexibility benefits described above, as well as sufficient hardness to be relatively dimensionally stable in handling and assembly. The hardness ranges described above, including between 10-70 Shore 00, have been found by the Applicant to strike a useful balance in radiation shielding and thermal transfer in combination with its ease of handling, including by automated equipment. In some embodiments, interface 310 may be a self-supporting body that is relatively dimensionally stable at room temperature, or may be less viscous, including liquidly dispensable for form-in-place applications. The hardness and modulus ranges described above are intended to apply to the present interfaces as installed at room temperature. Under operating conditions, with elevated temperatures, the hardness values of the present interfaces may be reduced, particularly in the event that phase-changing materials are employed in the polymeric matrices of the present interfaces.

The polymeric matrices of each of first, second, and third portions 18, 20, 22 may be fabricated from the same or different materials as desired per application, with the overall modulus and hardness of the interface pad 10 being an important aspect. Respective filler materials may be mixed and matched as desired within the respective portions of interface pad 10 in accordance with the methodology of sequential layer formation, as described below.

The construction of interface pad 10 described with reference to FIG. 1 provides an electrically isolative structure due to the incorporation of electrically insulative portions 18, 20 disposed at first and second sides 12, 14 of pad 10. As a result, interface pad 10 may be utilized in applications where respective components are desired to be electrically isolated from one another. Moreover, the construction of interface pad 10 enables both electrical isolation and electromagnetic and radio frequency radiation suppression due to the inclusion of suppression material 32 within third portion 22. Accordingly, electromagnetic and/or radio frequency interference emanating from, for example, a component coupled at first side 12 of pad 10 is, to a large extent, absorbed or reflected by third portion 22 so as not to transmit throughout thickness "T" of pad 10. Preferably, at least about 10% and up to about 90% of EMI and RFI is either absorbed or reflected back toward a source positioned at, for example, first side 12. Accordingly, less than about 90% of EMI or RFI is allowed to transmit through interface pad 10 of the present invention. In some embodiments of the present invention, a radiation attenuation of at least 1 dB is achieved by the interface pad. This measure of shielding effectiveness may be measured by the following relationship:

$$S = -20 \log T_i/I_o$$

Wherein,
S=shielding effectiveness
$T_i$=transmitted radiation
$I_o$=incident radiation This measure of shielding effectiveness is well known in the art for determining the effectiveness of materials in shielding electromagnetic radiation.

As described above, a further utility provided by interface pad 10 is in the thermal conductivity of at least certain portions thereof. In preferred embodiments, each of first, second, and third portions 18, 20, 22 include thermally conductive filler material disposed therein so as to render the entire thickness "T" of interface pad 10 as having a relatively high thermal conductivity value (>1 w/m*k). In such a manner, thermal energy is allowed to pass through interface pad 10, while EMI and RFI transmittance is substantially suppressed.

In another embodiment of the present invention illustrated in FIG. 2, interface pad 110 includes a structure as described above with respect to interface pad 10 and including an electrically insulative shielding member 134 disposed between first and second sides 112, 114 thereof. Shielding member 134 is preferably fabricated from an electrically insulative material such as woven fabric made from glass, graphite, and the like. Shielding member 134, therefore, provides an additional barrier to electrical conductance through thickness "T" of interface pad 110. In addition, shielding member 134 provides physical reinforcement to interface pad 110 as a relatively solid substrate layer. In the embodiment illustrated in FIG. 2, shielding member 134 may preferably be disposed in first or second portions 118, 120, but may instead be disposed within third portion 122.

In addition, a plurality of distinct shielding members 134 may be incorporated within interface pad 110, as desired per application.

Shielding member 134 preferably extends throughout an area of interface pad 110 defined by length "L" and width "W", but instead may only extend throughout a portion of the area of interface pad 110.

A further embodiment of the present invention is illustrated in FIG. 3 as interface pad 210, which includes an interference suppression portion 222 disposed between first and second sides 212, 214 thereof. Interference suppression portion 222 is preferably formed of materials as described with reference to third portion 22 of FIG. 1. However, interference suppression portion 222 extends only partially throughout an effective area of interface pad 210. FIG. 4 further illustrates the enclosed nature of interference suppression portion 222 to which interference suppression material 232 is solely confined.

As is described further hereinbelow, the interface pads of the present invention, such as interface pad 210, may be prepared as compilations of a plurality of distinct material layers. As such, interface pad 210 includes a first layer 203 comprising an electrically insulative material as described above, a second layer 204 having multiple mutually distinct portions 205, 206, and 222, and a third layer 207 comprising an electrically insulative material as described above. Distinct portions 205, 206 of second layer 204 are preferably discrete blocks of electrically insulative material laid up into interface pad 210 separate and apart from interference suppression portion 222.

EXAMPLE

Two sample sets of interface pads were prepared, with a first set having a thickness dimension of 1 mm ("thin" samples), and the second sample set having a thickness dimension of 3 mm ("thick" sample set). The two sample sets were otherwise identical in composition, with the interface pads being prepared from the following composition:

| Ingredient | Density (g/ml) | Wt. Fraction | Volume Fraction |
|---|---|---|---|
| Nusil Gel2 A Silicone Resin | 0.970 | 0.0972 | 0.2160 |
| Nusil Gel2 B Silicone Resin | 0.970 | 0.1458 | 0.3239 |
| 512 Catalyst | 1.020 | 0.0016 | 0.0034 |
| Steward MnZn Powder, 73401 | 5.120 | 0.0632 | 0.0266 |
| Steward FeSi III | 6.100 | 0.0754 | 0.0266 |
| Steward 992 Fe/Si/Al alloy | 7.190 | 0.1051 | 0.0315 |
| Steward 987 Fe/Si/Al alloy | 6.800 | 0.0839 | 0.0266 |
| TCP-8 Al powder | 2.700 | 0.2674 | 0.2134 |
| TCP-3 Al powder/TCP4 Al powder (1:3.7 by wt) | 2.700 | 0.1458 | 0.1164 |
| Carbon Black | 2.000 | 0.0146 | 0.0157 |

The fillers were distributed in the silicone resins, which were coated on both sides of a 0.06 mm thick woven fiberglass layer, which was nominally in the midplane of the final construction.

The samples were measured using S-band and G-band rectangular waveguide sections, with the radiation source of between 2.60-5.85 GHz being an HP 85-10. Post-processing TRL calibration was used with a 12-term error model that corrects for reflections and cross-talk associated with a two-port system. The samples were cut to fit within each waveguide sample holder. Due to the softness of the material, some imperfections in the placement of the samples in the sample holder were noted.

The samples were tested for both radiation return loss and insertion loss, measured in dB. Multiple samples within each sample set were measured, and the results were averaged together. The return loss of a material is directly related to the measured reflection coefficient ($\Gamma$) as follows:

$$RL = 20 \log_{10}(\Gamma)$$

Figure 7A:
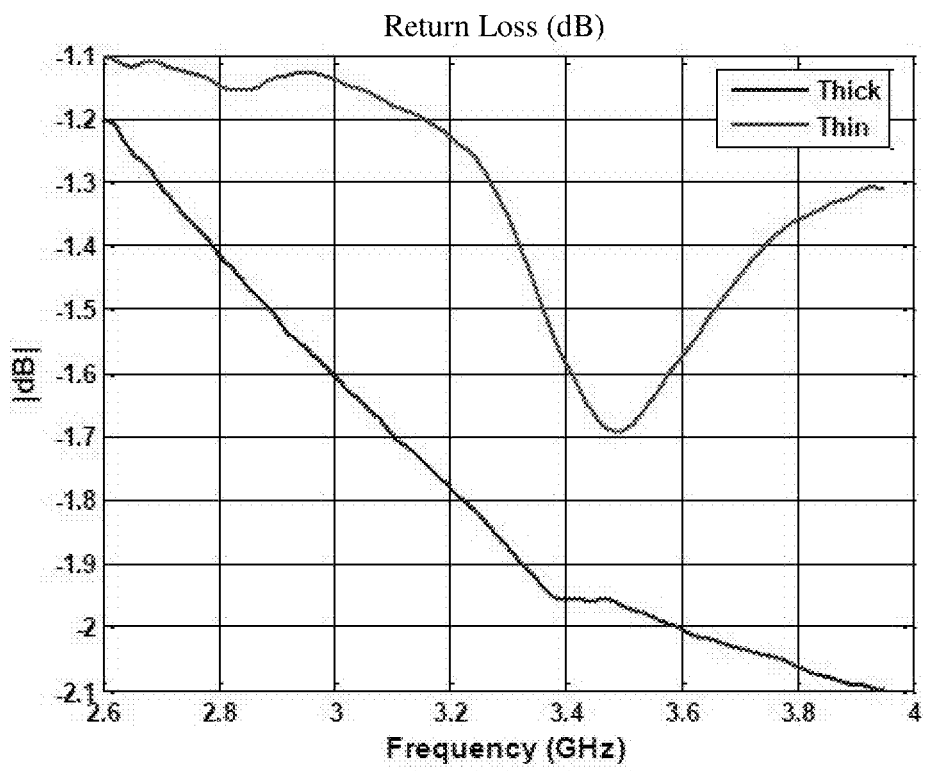
FIG. 7A is a chart showing return loss of radiation tested upon an electromagnetic interference suppression apparatus of the present invention.

The insertion loss is found in a similar fashion using the measured transmission coefficient. The measured reflection coefficient is comprised of reflections from both faces of the sample (as the energy propagates through). In general, as return loss (RL) approaches zero, more energy is being reflected back by the sample. FIG. 7A shows the RL of the thick and thin samples from 2.60-3.95 GHz. The large dip in the RL seen in the thin samples at about 3.5 GHz is believed to be an artifact caused by sample distortion and placement.

Figure 7B:
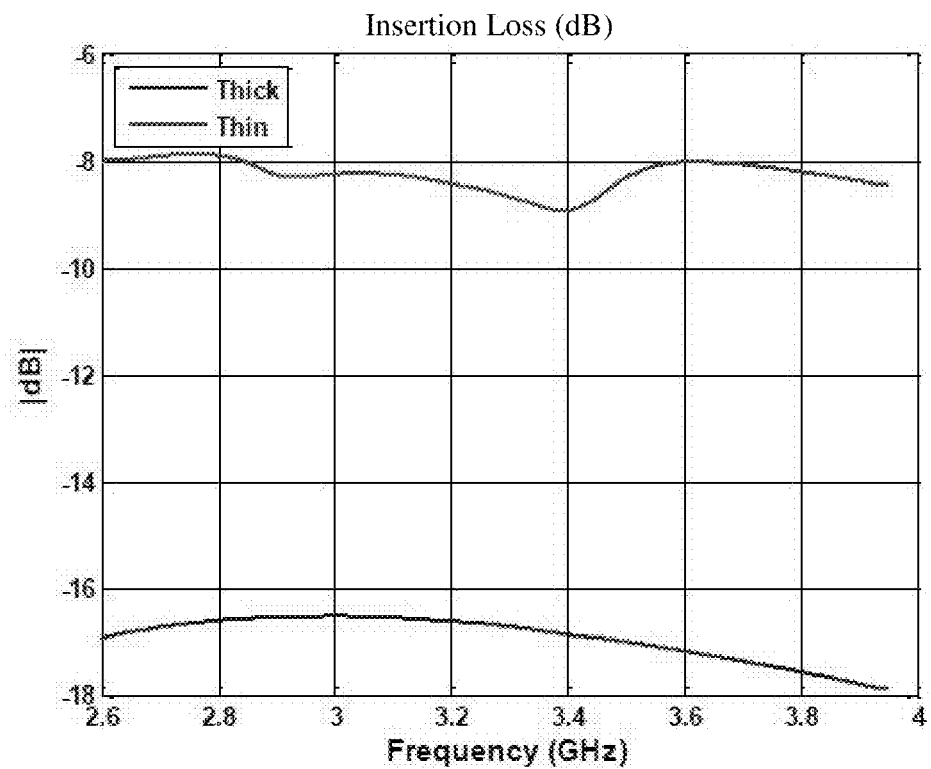
FIG. 7B is a chart showing insertion loss of radiation tested upon an electromagnetic interference suppression apparatus of the present invention.

Insertion Loss in the S-band (2.60-3.95 GHz) is shown in FIG. 7B, and indicates that less energy is transmitted through the thick sample, as would be expected. The thick sample attenuates the propagating radiation about twice as effectively.

Figure 7C:
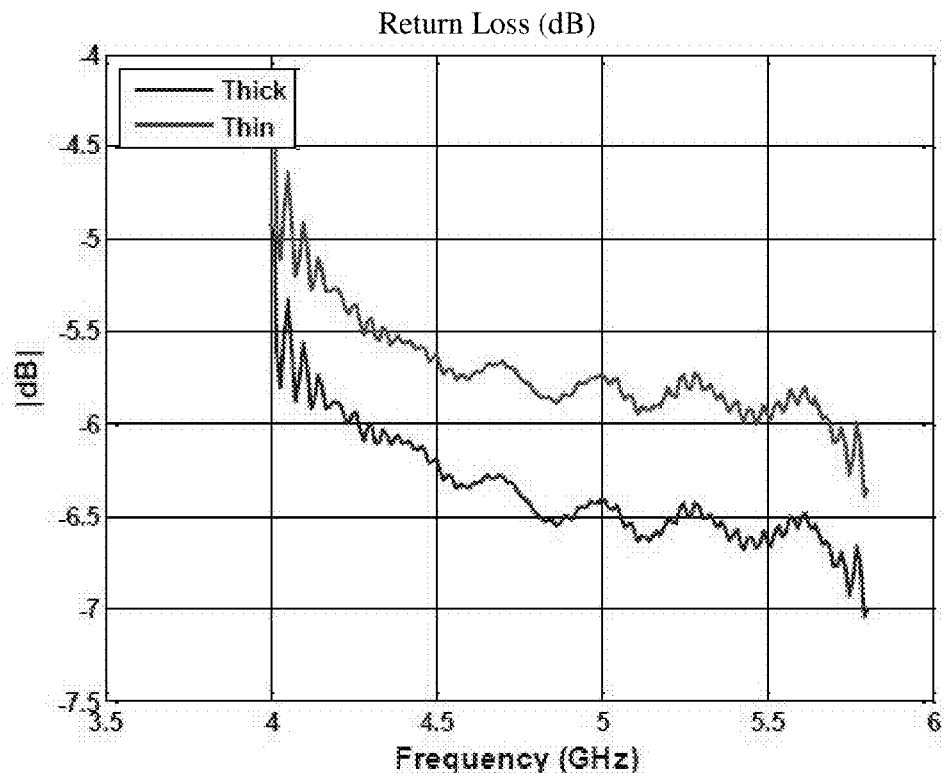
FIG. 7C is a chart showing return loss of radiation tested upon an electromagnetic interference suppression apparatus of the present invention.
Figure 7D:
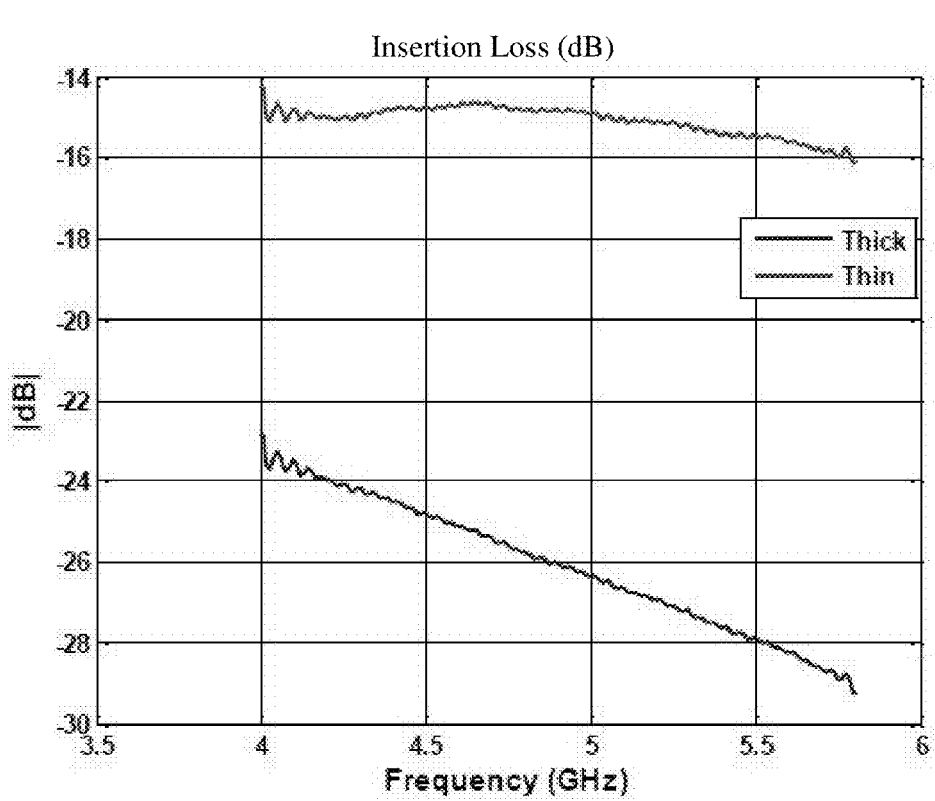
FIG. 7D is a chart showing insertion loss of radiation tested upon an electromagnetic interference suppression apparatus of the present invention.

FIGS. 7C and 7D show the return and insertion loss, respectively, of the samples measured in the G-band radiation, between 4.0-5.85 GHz.

The results indicate that the present samples are effective in attenuating radiation transmission in the frequency ranges most likely to be present in electronic device applications.

The invention has been described herein in considerable detail in order to comply with the patent statutes, and to provide those skilled in the art with the information needed to apply the novel principles and to construct and use embodiments of the invention as required. However, it is to be understood that various modifications can be accomplished without departing from the scope of the invention itself.

The invention claimed is:

1. An electromagnetic interference suppression apparatus, comprising a body having a first surface and a generally opposed second surface defining a thickness therebetween, said body exhibiting
a thermal conductivity of at least 1 W/m·K through the thickness,
a hardness of between 10-70 Shore 00 at 20° C., and
a volume electrical resistivity of at least $10^8$ $\Omega$·m,
said body having a first portion and a second portion, said first portion is an electromagnetic radiation absorbing and thermally conductive layer consisting of:
Mn—Zn ferrite powder, and
thermally conductive particulate material selected from the group consisting of alumina, aluminum trihydrate, aluminum nitride, aluminum oxide, boron nitride, zinc nitride, silicon carbide, and combinations thereof,
each of said Mn—Zn ferrite powder and said thermally conductive particulate material being dispersed in a polymeric matrix, said first portion being spaced from at least one of said first and second surfaces,
wherein said Mn—Zn ferrite powder is confined to said first portion of said body,
said second portion is a thermally conductive layer comprising:
thermally conductive particulate material selected from the group consisting of alumina, aluminum trihydrate, aluminum nitride, aluminum oxide, boron nitride, zinc nitride, silicon carbide, and combinations thereof, with the thermally conductive particulate material being dispersed in a polymeric matrix, and
a reinforcement member.

2. The electromagnetic interference suppression apparatus as in claim 1 wherein said polymeric matrix of said first and second portions is selected from silicone, polyethylene, polybutadiene, acrylic, epoxy, urethane, polysulfide, polyisobutylene, polyvinyl or polyolefin based polymers, and combinations thereof.

3. The electromagnetic interference suppression apparatus as in claim 2, wherein said first portion is spaced from said second surface, said second portion is coextensive with said second surface, and said reinforcing member is spaced from said first and second surfaces.

4. The electromagnetic interference suppression apparatus as in claim 3 wherein said reinforcing member is electrically insulative.

5. The electromagnetic interference suppression apparatus as in claim 1 wherein said first portion is spaced from both said first and second surfaces.

6. An electromagnetic interference suppression apparatus, comprising a body having a first surface and a generally opposed second surface defining a thickness therebetween, said body exhibiting
   a thermal conductivity of at least one W/m·K through the thickness,
   a hardness of between 10-70 Shore 00 at 20° C., and
   a volume electrical resistivity of at least $10^8$ Ω·m,
   said body having a first portion and a second portion, said first portion is an electromagnetic radiation absorbing and thermally conductive layer consisting of:
   Mn—Zn ferrite powder, and
   thermally conductive particulate material selected from a group consisting of alumina, aluminum trihydrate, and combinations thereof,
   each of said Mn—Zn ferrite powder and said thermally conductive particulate material being dispersed in a polymeric matrix, and said first portion being spaced from at least one of said first and second surfaces,
   wherein said Mn—Zn ferrite powder is confined to said first portion of said body,
   said second portion is a thermally conductive layer comprising:
   thermally conductive particulate material selected from group consisting of alumina, aluminum trihydrate, and combinations thereof, and
   a reinforcement member,
   with the thermally conductive particulate material being dispersed in a polymeric matrix.

7. The electromagnetic interference suppression apparatus as in claim 6 wherein said polymeric matrix of said first and second portions is selected from silicone, polyethylene, polybutadiene, acrylic, epoxy, urethane, polysulfide, polyisobutylene, polyvinyl or polyolefin based polymers, and combinations thereof.

8. The electromagnetic interference suppression apparatus as in claim 7, wherein said first portion is spaced from said second surface, said second portion is coextensive with said second surface, and said reinforcing member is spaced from said first and second surfaces.

9. The electromagnetic interference suppression apparatus as in claim 8 wherein said reinforcing member is electrically insulative.

10. The electromagnetic interference suppression apparatus as in claim 6 wherein said first portion is spaced from both said first and second surfaces.

* * * * *